(12) United States Patent
Ogawa

(10) Patent No.: US 7,679,456 B2
(45) Date of Patent: Mar. 16, 2010

(54) SEMICONDUCTOR INTEGRATED CIRCUIT AND METHOD OF TESTING SAME

(75) Inventor: Hayato Ogawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 29 days.

(21) Appl. No.: 12/081,771

(22) Filed: Apr. 21, 2008

(65) Prior Publication Data

US 2008/0265934 A1  Oct. 30, 2008

(30) Foreign Application Priority Data

Apr. 27, 2007  (JP) ............................. 2007-118261

(51) Int. Cl.
*G01R 23/00* (2006.01)
*H03L 7/07* (2006.01)

(52) U.S. Cl. ............................................ 331/44; 331/2

(58) Field of Classification Search ................. 331/1 A, 331/2, 16, 18, 44; 327/147–150, 156–159
See application file for complete search history.

(56) References Cited

U.S. PATENT DOCUMENTS 5,144,254 A * 9/1992 Wilke .......................... 327/107

FOREIGN PATENT DOCUMENTS

| JP | 03-040266 | 2/1991 |
| JP | 2005-277472 | 10/2005 |
| KR | 2001-0050500 | 6/2001 |

OTHER PUBLICATIONS

Korean Office Action dated Jun. 23, 2009 with a partial English translation.

* cited by examiner

*Primary Examiner*—David Mis
(74) *Attorney, Agent, or Firm*—McGinn IP Law Group, PLLC

(57) ABSTRACT

A semiconductor integrated circuit includes S PLLs (S is an integer satisfying $S \geq 2$), and the (k−1)th PLL $12_{(k-1)}$ (k is an integer satisfying $2 \leq k \leq S$) is connected to the kth PLL $12_k$ in the test mode. In this manner, the examination of S PLLs can be performed in a single test, and thereby it can reduce the time needed to examine PLLs in the semiconductor integrated circuit having a plurality of PLLs.

16 Claims, 9 Drawing Sheets

SEMICONDUCTOR INTEGRATED CIRCUIT AND METHOD OF TESTING SAME

BACKGROUND OF THE INVENTION

1. Field of the Invention

The present invention relates to a semiconductor integrated circuit and method of testing the same.

2. Description of Related Art

In recent years, as an LSI (Large Scale Integration) has gotten larger in scale, the number of PLLs (Phase-Locked Loops) embedded in an LSI has been increasing. Consequently, the testing time of PLLs embedded in a LSI has been problematically getting longer.

A conventional method of testing PLLs embedded in a LSI is explained hereinafter with reference to FIG. 8. In FIG. 8 shows an exemplary case where a LSI 1000 has two PLLs, i.e., first PLL 1001 and second PLL 1002. A test device 2000 for testing a PLL includes a signal generator 2001 and a signal measuring device 2002. The test device 2000 also includes switches 2003 and 2004. The switch 2003 changes the connection from the signal generator 2001 between the first PLL 1001 and second PLL 1002. Likewise, the switch 2004 changes the connection to the signal measuring device 2002 between the first PLL 1001 and second PLL 1002.

Then, to test the PLLs embedded in the LSI 1000, firstly, the first PLL 1001 is connected to the signal generator 2001 and signal measuring device 2002 by the first and second switches 2003 and 2004. In this state, a clock having a frequency ft outputted from the signal generator 2001 is inputted to the first PLL 1001, and the frequency is frequency-multiplied by N at the first PLL 1001. Then, the clock having a frequency N×ft outputted from the first PLL 1001 is measured in the signal measuring device 2002, and the test of the first PLL 1001 has been completed. Next, by changing the switches 2003 and 2004, the second PLL 1002 is connected to the signal generator 2001 and signal measuring device 2002. In this state, a clock having a frequency ft outputted from the signal generator 2001 is inputted to the second PLL 1002, and the frequency is frequency-multiplied by M at the second PLL 1002. Then, the clock having a frequency M×ft outputted from the second PLL 1002 is measured in the signal measuring device 2002, and the test of the second PLL 1002 has been completed.

FIG. 9 shows a more concrete example of the circuit shown in FIG. 8. As shown in FIG. 9, selectors 1004 and 1005 are connected to the first and second PLLs 1001 and 1002 respectively. In a normal operation mode, the selectors 1004 and 1005 select a clock generated by an OSC (oscillator) 1003, and this clock is inputted to the first and second PLLs 1001 and 1002. On the other hand, in a test mode, the selectors 1004 and 1005 select a clock generated by the signal generator 2001, and this clock is inputted to the first and second PLLs 1001 and 1002. Furthermore, first and second logic circuits 1006 and 1007 are connected to the first and second PLLs 1001 and 1002. The first and second logic circuits 1006 and 1007 become active with the clock outputted from the first and second PLLs 1001 and 1002 in the normal mode. Furthermore, the test device 2000 outputs a control signal for controlling the switching of the selector 1004 and 1005.

Then, to test the PLLs embedded in the LSI 1000, firstly, the first PLL 1001 is connected to the signal generator 2001 by a switch 2005, and the first PLL 1001 is also connected to the signal measuring device 2002 by a switch 2006. At the same time, the test device 2000 inputs the control signal to the selector 1004 such that a clock generated by the signal generator 2001 is inputted to the first PLL 1001. In this state, a clock having a frequency ft outputted from the signal generator 2001 is inputted to the first PLL 1001, and the frequency is frequency-multiplied by N at the first PLL 1001. Then, the clock having a frequency N×ft outputted from the first PLL 1001 is measured in the signal measuring device 2002, and the test of the first PLL 1001 has been completed. Next, the second PLL 1002 is connected to the signal generator 2001 by changing the switch 2005, and the second PLL 1002 is also connected to the signal measuring device 2002 by changing the switch 2006. At the same time, the test device 2000 inputs the control signal to the selector 1005 such that a clock generated by the signal generator 2001 is inputted to the second PLL 1002. In this state, a clock having a frequency ft outputted from the signal generator 2001 is inputted to the second PLL 1002, and the frequency is frequency-multiplied by M at the second PLL 1002. Then, the clock having a frequency M×ft outputted from the second PLL 1002 is measured in the signal measuring device 2002, and the test of the second PLL 1002 has been completed.

However, in the method shown in FIGS. 8 and 9, in the case where a plurality of PLLs are embedded in a LSI, a test has to be performed the same number of times as the number of the PLLs embedded in the LSI to complete the PLL test. Therefore, the testing time of the PLLs gets problematically longer. Furthermore, since both a signal generator and a signal measuring device are expensive, it will be unrealistic to use several test devices simultaneously. In addition, the number of signal generators and signal measuring devices embedded in a single test device is two channels or three at the maximum, and even so it cannot test more than two PLLs simultaneously.

Meanwhile, it is known to test two PLLs simultaneously for a LSI having two PLLs by inputting a clock delayed by a delay circuit to one of the PLLs, comparing the outputted clocks from the two PLLs by a comparator, and detecting the failure of the PLLs from the phase difference between the outputted clocks from the two PLLs. (For example, Japanese Unexamined Patent Application Publication No. 2005-277472 (Ogawa))

However, the technique described in Ogawa can only compare the phase difference between two input clocks, and cannot cope with a LSI having more than two PLLs.

SUMMARY

In one embodiment, a semiconductor integrated circuit includes S phase-locked loop circuits (S is an integer satisfying S≧2), wherein the (k−1)th phase-locked loop circuit is connected to the kth phase-locked loop circuit in series (k is an integer satisfying 2≦k≦S) in a test mode. In other words, the semiconductor integrated circuit is constructed such that each phase-locked loop circuit is connected in series in the test mode. With this structure, when a signal generator is connected to a phase-locked loop circuit in the most upstream and a signal measuring device is connected to a phase-locked loop circuit in the most downstream, the clock generated by the signal generator is inputted to the phase-locked loop circuit in the most upstream, passed through each phase-locked loop circuit in sequence, outputted from the phase-locked loop circuit in the most downstream, and measured by the signal measuring device. In other words, the examination of each of S phase-locked loop circuits embedded in a semiconductor integrated circuit can be performed in a single test, and thereby it can reduce the time needed to examine phase-locked loop circuits even if the semiconductor integrated circuit has a plurality of phase-locked loop circuits.

In accordance with one aspect, the present invention enables to reduce the testing time of PLLs.

BRIEF DESCRIPTION OF THE DRAWINGS

The above and other objects, advantages and features of the present invention will be more apparent from description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments in accordance with the present invention are explained hereinafter. However, it should be understood that the present invention is not limited to those embodiments.

Figure 1:
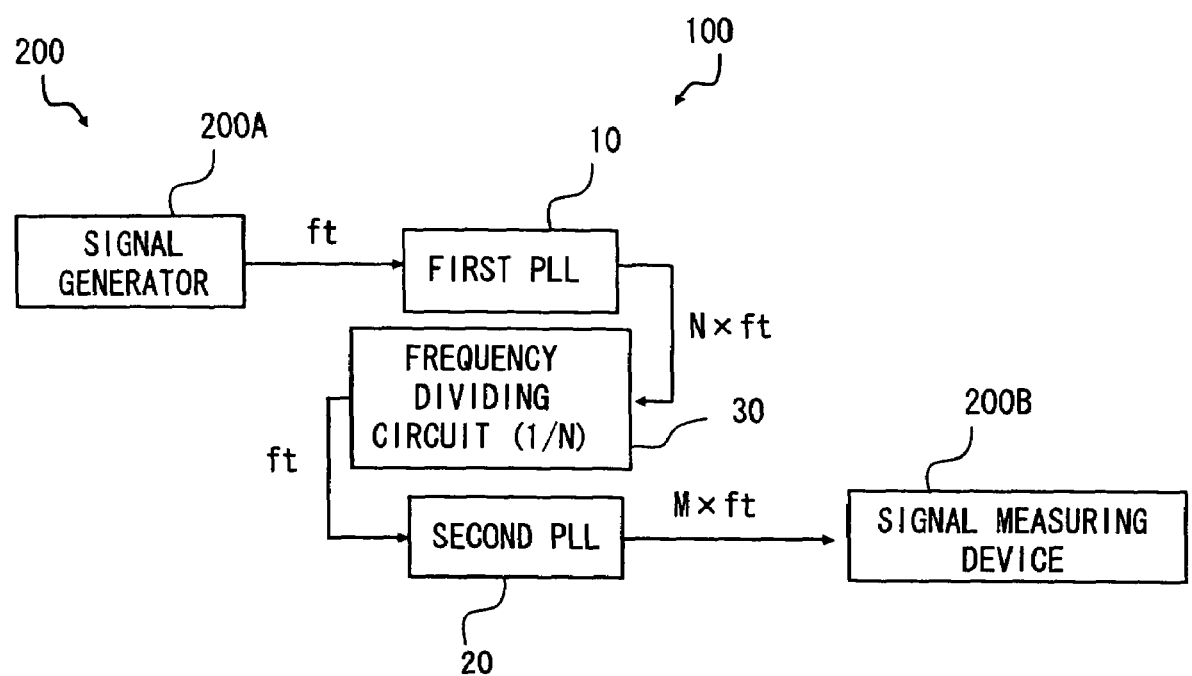
FIG. 1 is a block diagram showing a schematic structure of a LSI and a test device in accordance with one aspect of the present invention.

Firstly, the basic concept of the present invention is explained hereinafter. FIG. 1 is a block diagram showing a schematic structure of a large-scale semiconductor integrated circuit (LSI) 100 and a test device embedded on the LSI 100 in accordance with one aspect of the present invention.

As shown in FIG. 1, the LSI 100 in the embodiment of the present invention includes, for example, a first PLL 10, a frequency dividing circuit 30 to which an output clock from the first PLL 10 is inputted, a second PLL 20, and the like connected to the first PLL 10 through the frequency dividing circuit 30.

The term "connection" means not only a direct connection, but also an indirect connection through another circuit or the like.

The test device 200 includes a signal generator 200A, a signal measuring device 200B and the like.

Assume that the first PLL 10 has a frequency multiplication factor N. Assume also that second PLL 20 has a frequency multiplication factor M. Assume also that the frequency dividing circuit 30 has a frequency division factor equivalent to the reciprocal of the frequency multiplication factor of the first PLL 10. That is, the frequency division factor of the frequency dividing circuit 30 is 1/N.

In a test mode in which the PLL test is performed in the LSI 100, the signal generator 200A generates a test clock having frequency ft, and the test clock is inputted to the first PLL 10. Next, the test clock having the frequency ft is frequency-multiplied by N at the first PLL 10. Next, the output clock having the frequency N×ft from the first PLL 10 is inputted to the frequency dividing circuit 30, and frequency-divided to 1/N at the frequency dividing circuit 30. Next, the output clock having the frequency ft from the frequency dividing circuit 30 is inputted to the second PLL 20, and frequency-multiplied by M at the second PLL 20. Then, the signal measuring device 200B measures the clock having the frequency M×ft. In other words, the first PLL 10 and second PLL 20 are connected in series through the frequency dividing circuit 30 in the test mode.

In this point, if one or both of the first PLL 10 and second PLL 20 are defective, the clock measured at the signal measuring device 200B does not have the frequency M×ft. In this manner, the examination of each phase-locked loop circuit embedded in the LSI 100 can be performed in a single test.

First Embodiment

Figure 2:
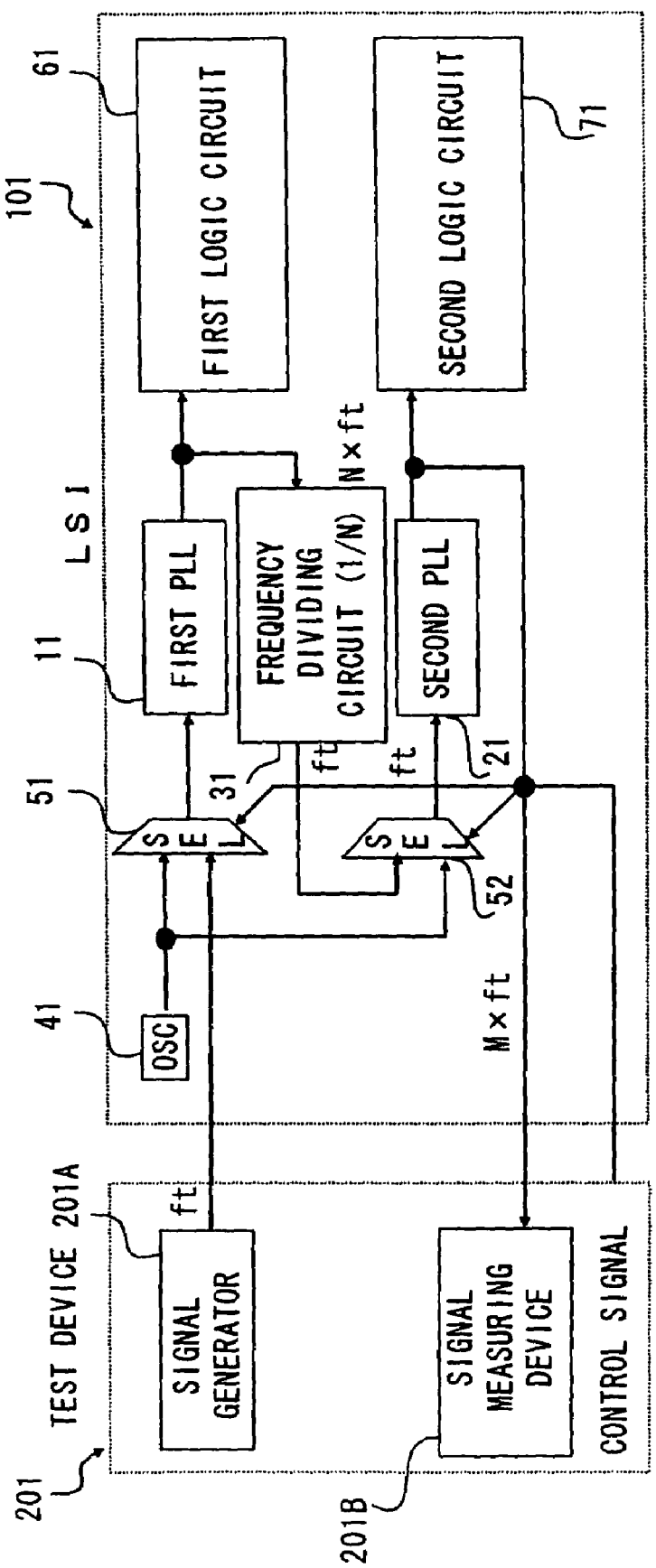
FIG. 2 is a block diagram showing a schematic structure of a LSI and a test device in accordance with a first embodiment of the present invention.

A LSI 101 in accordance with a first embodiment of the present invention is explained hereinafter with reference to FIG. 2. FIG. 2 is a block diagram showing a schematic structure of the LSI 101 and a test device 201 in accordance with a first embodiment of the present invention.

As shown in FIG. 2, the test device 201 includes a signal generator 201A, a signal measuring device 201B and the like.

The signal generator 201A, for example, generates and outputs a test clock having frequency ft at which the test for the PLL (phase-locked loop) embedded in the LSI 101 is performed. In particular, the signal generator 201A generates a test clock having frequency ft which is equivalent to the base clock frequency of a clock having frequency f generated by an OSC (oscillator clock) 41 (the detail of which is explained later).

The signal measuring device 201B measures, for example, the frequency of a clock outputted from a PLL embedded in the LSI 101. Furthermore, the test device 201 outputs a control signal for controlling selectors 51 and 52 embedded in the LSI 101 (the detail of selectors are explained later).

As shown in FIG. 2, the LSI also includes an OSC (Oscillator Clock) 41 for generating a clock having frequency f; selectors 51 and 52 connected in the downstream of the OSC 41; a first PLL 11 connected to the OSC 41 through the selector 51; a second PLL 21 connected to the OSC 41 through the selector 52; frequency dividing circuit 31 connected between the first PLL 11 and second PLL 21; a first logic circuit 61 operating with the output clock from the first PLL 11; and a second logic circuit 71 operating with the output clock from the second PLL 21.

Incidentally, the OSC may be arranged on the outside of the LSI 101. In other words, the clock having the frequency f may be supplied from an external source.

Assume that the first PLL 11 has a frequency multiplication factor N. Assume also that second PLL 21 has a frequency multiplication factor M. Furthermore, in a test mode, the frequency dividing circuit 31 frequency-divides the output clock from the first PLL 11 such that the resulting frequency is equal to the frequency of an input clock to the second PLL 21 operating in the normal mode. Specifically, the frequency dividing circuit 31 has a frequency division factor equivalent to the reciprocal of the frequency multiplication factor of the first PLL 11. That is, the frequency division factor of the frequency dividing circuit 31 is 1/N.

The term "normal mode" means a mode in which a clock having frequency f generated by the OSC 41 is frequency-multiplied by N and M at the first and second PLLs 11 and 21 respectively, and each signal is supplied to the first and second logic circuits 61 and 71 respectively so that the first and second logic circuits 61 and 71 operate.

Furthermore, the term "test mode" means a mode in which the test for the PLLs embedded in the LSI 101 (i.e., the first and second PLLs 11 and 21 in this embodiment) is performed.

The selector 51 connected to the first PLL 11 receives a clock having frequency f generated by the OSC 41 and a test clock having frequency ft generated by the signal generator 201A.

Then, the selector 51 selects and outputs the clock having frequency f generated by the OSC 41 to the first PLL 11 in the normal mode, and selects and outputs the test clock having frequency ft generated by the signal generator 201A to the first PLL 11 in the test mode.

Meanwhile, the selector 52 connected to the second PLL 21 receives a clock having frequency f generated by the OSC 41 and an output clock from the frequency dividing circuit 31.

Then, the selector 52 selects and outputs the clock having frequency f generated by the OSC 41 to the second PLL 21 in the normal mode, and selects and outputs the output clock from the frequency dividing circuit 31 to the second PLL 21 in the test mode.

That is, in the test mode, the first PLL 11 and second PLL 21 are connected in series through the frequency dividing circuit 31. In other words, in the test mode, the output clock from the first PLL 11 is inputted to the frequency dividing circuit 31, and the output clock from the frequency dividing circuit 31 is inputted to the second PLL 21.

Therefore, in the test mode, the test clock having frequency ft generated by the signal generator 201A is inputted to the first PLL 11. Then, since the test clock having the frequency ft is frequency-multiplied by N at the first PLL 11, a clock having frequency N×ft is inputted to the first logic circuit 61 and frequency dividing circuit 31. Then, since the clock having the frequency N×ft is frequency-divided to 1/N, a clock having frequency ft is inputted to the second PLL 21. Then, since the clock having the frequency ft is frequency-multiplied by M at the second PLL 21, a clock having frequency M×ft is inputted to the second logic circuit 71 and signal measuring device 201B.

That is, similarly to the normal mode, a clock having the same frequency is inputted to the first and second PLLs 11 and 21, and a clock multiplied by N and a clock multiplied by M are inputted to the first and second logic circuits 61 and 71 respectively even in the test mode.

Next, a method of testing a LSI 101 in accordance with the first embodiment of the present invention is explained hereinafter. A method of testing a LSI 101 in accordance with the present invention is used to examine PLLs embedded in the LSI 101.

Firstly, a test device 201 is connected to the LSI 101. In particular, a signal generator 201A is connected to a selector 51 located in the upstream of a first PLL 11, and a signal measuring device 201B is connected in the downstream of a second PLL 21.

Next, the signal generator 201A generates a test clock having frequency ft. At the same time, the test device 201 sends a control signal such that the selector 51 connected to the first PLL 11 inputs the test clock having frequency ft generated by the signal generator 201A to the first PLL 11. Furthermore, the test device 201 sends a control signal such that the selector 52 connected to the second PLL 21 inputs the output clock from the frequency dividing circuit 31 to the second PLL 21. Then, the signal measuring device 201B measures the frequency of the output clock from the PLL 21.

At this point, if the PLL 11 functions normally, the frequency of the output clock from the PLL 11 becomes the frequency N×ft. Next, since the output clock from the PLL 11 is frequency-divided by the frequency dividing circuit 31, the frequency of the input clock to the PLL 21 becomes the frequency ft. Then, if the PLL 21 functions normally, the frequency of the output clock from the PLL 21 becomes the frequency M×ft. Therefore, if one or both of the first and second PLLs 11 and 21 are defective, the clock measured at the signal measuring device 201B does not have the frequency M×ft. In this manner, the examination of a plurality of PLLs embedded in the LSI 101 can be performed in a single test.

As explained above, in the LSI 101 and the method of testing PLLs in the LSI 101, the first PLL 11 is connected to the second PLL 21 in series in the test mode. That is, a LSI 101 is constructed in such a manner that the first PLL 11 is connected to the second PLL 21 in series in a test mode. With this structure, when a signal generator 201A is connected to the PLL 11 and a signal measuring device 201B is connected to the PLL 21, a clock generated by the signal generator 201A is inputted to the PLL 11, and then inputted to the PLL 21. Then, the clock is frequency-multiplied at the PLL 21, and measured by the signal measuring device 201B. That is, the examination of the two PLLs embedded in a LSI 101 can be performed in a single test, and thereby it can reduce the time needed to examine PLLs even if the LSI 101 has two PLLs.

Incidentally, in this embodiment, the PLL 11 is connected to the PLL 21 through the frequency dividing circuit 31 in a test mode. However, a PLL designed for connection (phase-locked loop circuit designed for connection) may be used in place of the frequency dividing circuit 31 as appropriate, provided that the input signal to the PLL 21 in the test mode is the same as that in the normal mode.

Second Embodiment

Figure 3:
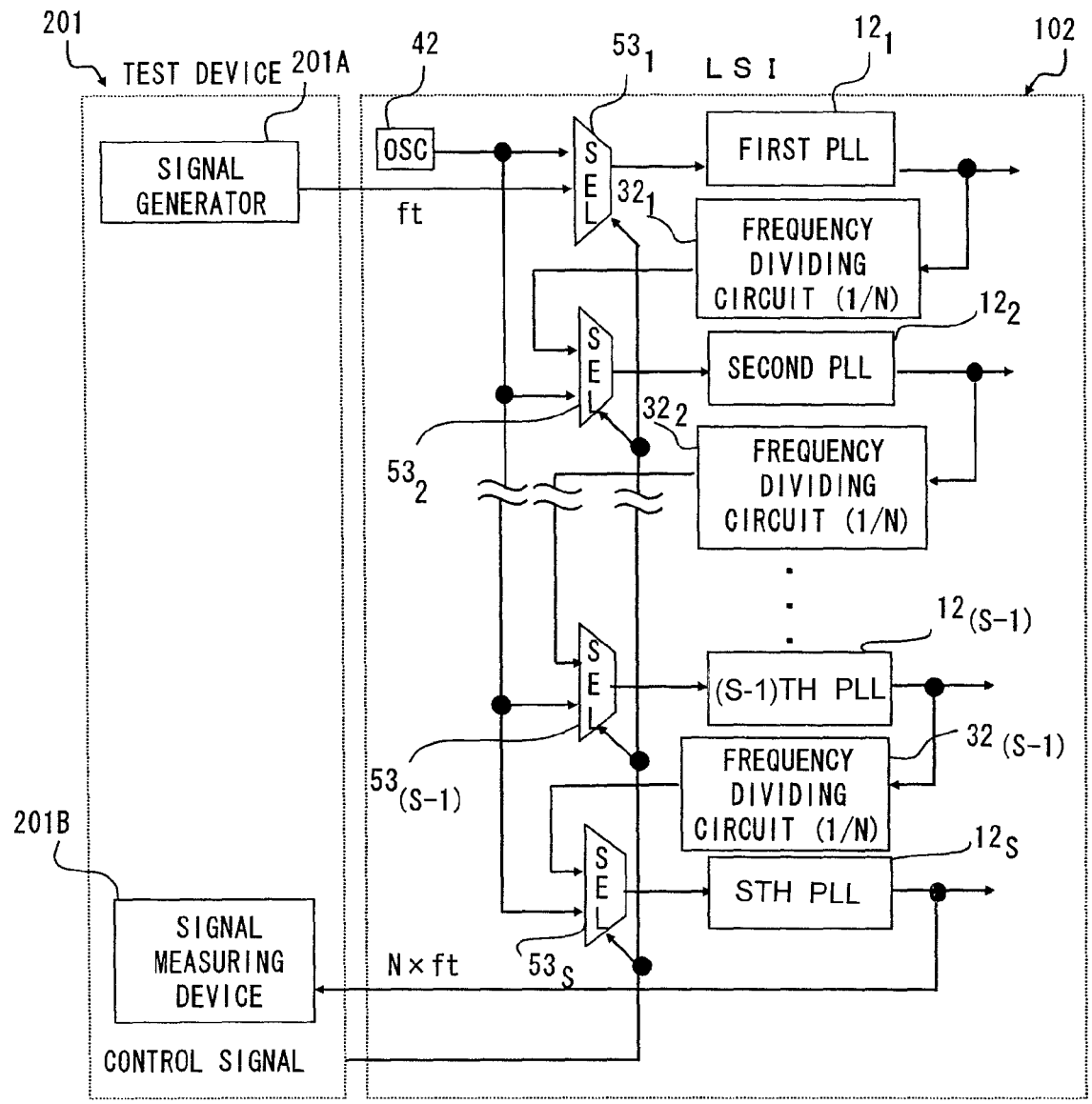
FIG. 3 is a block diagram showing a schematic structure of a LSI and a test device in accordance with a second embodiment of the present invention.

A LSI 102 in accordance with a second embodiment of the present invention is explained hereinafter with reference to FIG. 3. FIG. 3 is a block diagram showing a schematic structure of the LSI 102 in accordance with a second embodiment of the present invention.

Incidentally, a test device 201 in accordance with the second embodiment of the present invention has a similar structure to that of FIG. 2. Therefore, the same signs are assigned and the explanation is omitted.

As shown in FIG. 3, the LSI 102 has S PLLs (S is an integer satisfying $S \geq 2$). In particular, the LSI 102 includes: an OSC 42 for generating a clock having frequency f; S selectors $53_1$, $53_2, \ldots, 53_{(S-1)}$, and $53_S$ connected in the downstream of the OSC 42; a first PLL $12_1$, a second PLL $12_2, \ldots,$ a (S−1)th PLL $12_{(S-1)}$, and a Sth PLL $12_S$ connected to the OSC 42 through the selectors $53_1, 53_2, \ldots, 53_{(S-1)}, 53_S$ respectively; and S−1 frequency dividing circuits $32_1, 32_2, \ldots,$ and $32_{S-1}$ connected between the (k−1)th PLL $12_{(k-1)}$ (k is an integer satisfying $2 \leq k \leq S$) and kth PLL $12_k$ or the like in a test mode.

The LSI 102 also includes a first logic circuit operating with the output clock from the first PLL $12_1$ (not shown), a second logic circuit operating with the output clock from the second PLL $12_2$ (not shown), . . . , a (S−1)th logic circuit operating with the output clock from the (S−1)th PLL $12_{(S-1)}$ (not shown), and a Sth logic circuit operating with the output clock from the Sth PLL $12_S$ (not shown).

Incidentally, the OSC 42 may be arranged on the outside of the LSI 102, and a clock having frequency f may be inputted externally.

The first PLL $12_1$, second PLL $12_2$, ..., (S−1)th PLL $12_{(S-1)}$, and Sth PLL $12_S$ have a frequency multiplication factor N. Furthermore, in a test mode, the frequency dividing circuit $32_{k-1}$ to which an output clock from the (k−1)th PLL $12_{(k-1)}$ is inputted frequency-divides the output clock from the (k−1)th PLL $12_{(k-1)}$ such that the resulting frequency is equal to the frequency of an input clock to the kth PLL $12_k$ operating in the normal mode. Specifically, the frequency dividing circuit $32_{k-1}$ to which an output clock from the (k−1)th PLL $12_{(k-1)}$ is inputted has a frequency division factor equivalent to the reciprocal of the frequency multiplication factor of the (k−1)th PLL $12_{(k-1)}$. That is, the frequency division factor of the frequency dividing circuit $32_{k-1}$ to which an output clock from the (k−1)th PLL $12_{(k-1)}$ is inputted is 1/N. Incidentally, each PLL may have a difference value for the frequency multiplication factor.

The term "normal mode" means a mode in which a clock having frequency f generated by the OSC 42 is frequency-multiplied by N at the first PLL $12_1$, second PLL $12_2$, ..., (S−1)th PLL $12_{(S-1)}$, and Sth PLL $12_S$, and each of the resulting signal is supplied to the first logic circuit (not shown), second logic circuit (not shown), ..., (S−1)th logic circuit, and Sth logic circuit for the operation of the first logic circuit (not shown), second logic circuit (not shown), ..., (S−1)th logic circuit, and Sth logic circuit respectively.

Furthermore, the term "test mode" means a mode in which the test for the PLLs embedded in the LSI 102 (i.e., the first PLL $12_1$, second PLL $12_2$, ..., (S−1)th PLL $12_{(S-1)}$, and Sth PLL $12_S$ in this embodiment) is performed.

The selector $53_1$ connected to the first PLL $12_1$ receives a clock having frequency f generated by the OSC 42 and a test clock having frequency ft generated by the signal generator 201A.

Then, the selector $53_1$ selects and outputs the clock having frequency f generated by the OSC 42 to the first PLL $12_1$ in the normal mode, and selects and outputs the test clock having frequency ft generated by the signal generator 201A to the first PLL $12_1$ in the test mode.

Furthermore, the selector $53_k$ connected to the kth PLL $12_k$ receives a clock having frequency f generated by the OSC 42 and an output clock from the frequency dividing circuit $32_{k-1}$ to which an output clock from the (k−1)th PLL $12_{(k-1)}$ is inputted.

Then, the selector $53_k$ selects and outputs the clock having frequency f generated by the OSC 42 to the kth PLL $12_k$ in the normal mode, and selects and outputs the output clock from the frequency dividing circuit $32_{k-1}$ to the kth PLL $12_k$ in the test mode.

That is, in the test mode, the (k−1)th PLL $12_{(k-1)}$ and kth PLL $12_k$ are connected in series through the frequency dividing circuit $32_{k-1}$. Furthermore, in the test mode, each adjacent pair of the first PLL $12_1$, second PLL $12_2$, ..., (S−1)th PLL $12_{(S-1)}$, and Sth PLL $12_S$ are connected in series through the frequency dividing circuits $32_1$-$32_{S-1}$ respectively. In the other words, in the test mode, the output clock from the (k−1)th PLL $12_{(k-1)}$ is inputted to the frequency dividing circuit $32_{k-1}$, and the output clock from the frequency dividing circuit $32_{k-1}$ is inputted to the kth PLL $12_k$.

Therefore, in the test mode, the test clock having frequency ft generated by the signal generator 201A is inputted to the first PLL $12_1$. Then, since the test clock having the frequency ft is frequency-multiplied by N at the first PLL $12_1$, a clock having frequency N×ft is inputted to the first logic circuit (not shown). Furthermore, the clock having frequency N×ft is also inputted to the frequency dividing circuit $32_1$ connected in the immediate downstream of the first PLL $12_1$. Then, since the clock having the frequency N×ft is frequency-divided to 1/N at the frequency dividing circuit $32_1$, a clock having frequency ft is inputted to the second PLL $12_2$. Then, since the clock having the frequency ft is frequency-multiplied by N at the second PLL $12_2$, a clock having frequency N×ft is inputted to the second logic circuit 71 (not shown).

In a similar manner, a clock having frequency ft is inputted to the (S−1)th PLL $12_{(S-1)}$. Then, since the clock having the frequency ft is frequency-multiplied by N at the (S−1)th PLL $12_{(S-1)}$, a clock having frequency N×ft is inputted to the (S−1)th logic circuit (not shown). Furthermore, the clock having frequency N×ft is also inputted to the frequency dividing circuit $32_{S-1}$ connected in the immediate downstream of the (S−1)th PLL $12_{(S-1)}$. Then, since the clock having the frequency N×ft is frequency-divided to 1/N at the frequency dividing circuit $32_{S-1}$, a clock having frequency ft is inputted to the Sth PLL $12_S$. Then, since the clock having the frequency ft is frequency-multiplied by N at the Sth PLL $12_S$, a clock having frequency N×ft is inputted to the Sth logic circuit (not shown) and signal measuring device 201B.

That is, similarly to the normal mode, a clock having the same frequency is inputted to the first PLL $12_1$, second PLL $12_2$, ..., (S−1)th PLL $12_{(S-1)}$, and Sth PLL $12_S$, and a clock multiplied by N is inputted to the first logic circuit (not shown), second logic circuit (not shown), ..., (S−1)th logic circuit, and Sth logic circuit even in the test mode.

Next, a method of testing a LSI 102 in accordance with the second embodiment of the present invention is explained hereinafter. A method of testing a LSI 102 in accordance with the present invention is used to examine PLLs embedded in the LSI 102.

Firstly, a test device 201 is connected to the LSI 102. In particular, a signal generator 201A is connected to a selector $53_1$ located in the upstream of the first PLL $12_1$, and a signal measuring device 201B is connected in the downstream of the Sth PLL $12_S$.

Next, the signal generator 201A generates a test clock having frequency ft. At the same time, the test device 201 sends a control signal such that the selector $53_1$ connected to the first PLL $12_1$ inputs the test clock having frequency ft generated by the signal generator 201A to the first PLL $12_1$. Furthermore, the test device 201 sends a control signal such that the selector $53_k$ connected to the (k−1)th PLL $12_{(k-1)}$ inputs the output clock from the frequency dividing circuit $32_{k-1}$ to the kth PLL $12_k$. Then, the signal measuring device 201B measures the frequency of the output clock from the Sth PLL $12_S$.

At this point, if the first PLL $12_1$ functions normally, the frequency of the output clock from the first PLL $12_1$ becomes the frequency N×ft. Next, since the output clock from the first PLL $12_1$ is frequency-divided by the frequency dividing circuit $32_1$, the frequency of the input clock to the second PLL $12_2$ becomes the frequency ft. Similarly, the frequency of the input clock to the Sth PLL $12_S$ becomes the frequency ft. Then, if the Sth PLL $12_S$ functions normally, the frequency of the output clock from the Sth PLL $12_S$ becomes the frequency N×ft. In other words, if any one or all of the first PLL $12_1$, second PLL $12_2$, ..., (S−1)th PLL $12_{(S-1)}$, and Sth PLL $12_S$ are defective, the clock measured at the signal measuring device 201B does not have the frequency N×ft. In this manner, the examination of plural PLLs embedded in the LSI 102 can be performed in a single test.

As explained above, in the LSI 102 and the method of testing PLLs in the LSI 102, it includes S PLLs (S is an integer satisfying S≧2), and the (k−1)th PLL $12_{(k-1)}$ is connected to the kth PLL $12_k$ in the test mode. That is, a LSI 102 is constructed in such a manner that all PLLs are connected in series in a test mode. With this structure, when a signal generator 201A is connected to a PLL in the most upstream (first PLL $12_1$) and a signal measuring device 201B is connected to a PLL in the most downstream (Sth PLL $12_S$), the clock generated by the signal generator 201A is inputted to the PLL in the most upstream (first PLL $12_1$), passed through each PLL in sequence, outputted from the PLL in the most downstream (Sth PLL $12_S$), and measured by the signal measuring device 201B. That is, the examination of S PLLs embedded in a LSI 102 can be performed in a single test, and thereby it can reduce the time needed to examine PLLs even if the LSI 102 has a plurality of PLLs.

Incidentally, in this embodiment, the (k−1)th PLL $12_{(k-1)}$ is connected to the kth PLL $12_k$ through the frequency dividing circuit $32_{(k-1)}$ in a test mode. However, a PLL designed for connection (phase-locked loop circuit designed for connection) may be used in place of the frequency dividing circuit $32_{(k-1)}$ as appropriate, provided that the PLL designed for connection generates the same clock from the output signal from the (k−1)th PLL $12_{(k-1)}$ as the clock inputted to the kth PLL $12_k$ operating in the normal mode.

Third Embodiment

Figure 4:
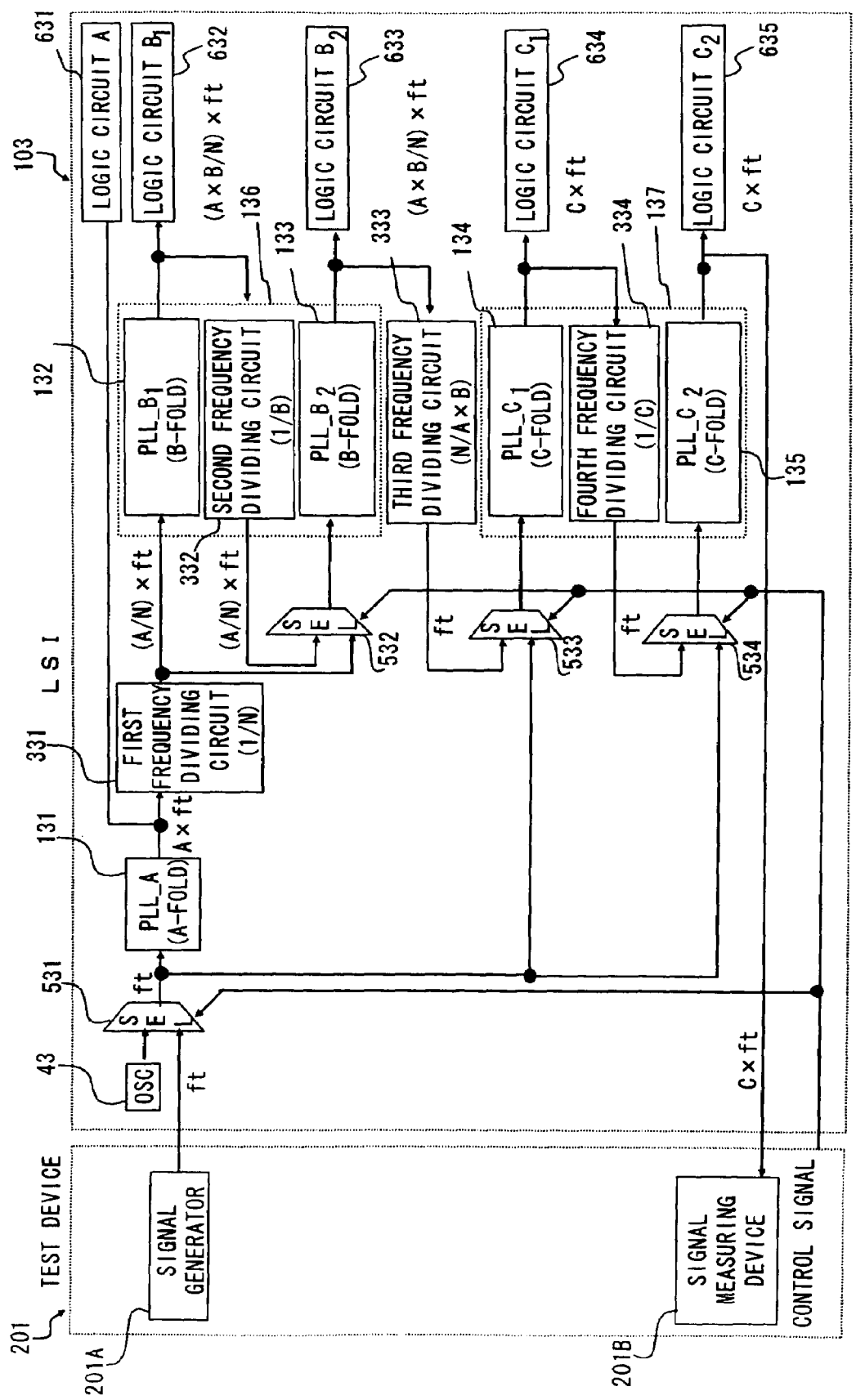
FIG. 4 is a block diagram showing a schematic structure of a LSI and a test device in accordance with a third embodiment of the present invention.

A LSI 103 in accordance with a third embodiment of the present invention is explained hereinafter with reference to FIG. 4. FIG. 4 is a block diagram showing a schematic structure of the LSI 103 in accordance with a third embodiment of the present invention.

Incidentally, a test device 201 in accordance with the third embodiment of the present invention has a similar structure to that of FIG. 2. Therefore, the same signs are assigned and the explanation is omitted.

As shown in FIG. 4, the LSI 103 includes two PLL groups, i.e., a first PLL group 136, second PLL group 137.

The first PLL group 136 includes two PLLs, i.e., $PLL\_B_1$ 132 and $PLL\_B_2$ 133 to which a clock having the same frequency (A/N)×ft is inputted in the normal mode. The second PLL group 137 includes two PLLs, i.e., $PLL\_C_1$ 134 and $PLL\_C_2$ 135 to which a clock having the same frequency ft is inputted.

In particular, the LSI 103 includes: an OSC 43; a PLL_A 131, a $PLL\_B_1$ 132, a $PLL\_B_2$ 133, a $PLL\_C_1$ 134, and a $PLL\_C_2$ 135; a first frequency dividing circuit 331, a second frequency dividing circuit 332, a third frequency dividing circuit 333, and a fourth frequency dividing circuit 334; a first selector 531, a second selector 532, a third selector 533, and a fourth selector 534 for changing input clocks to the PLL_A 131, $PLL\_B_2$ 133, $PLL\_C_1$ 134, and $PLL\_C_2$ 135 respectively; a logic circuit A 631, a logic circuit B1 632, a logic circuit B2 633, a logic circuit A1 634, and a logic circuit C2 635 operating with the output clocks from the PLL_A 131, $PLL\_B_1$ 132, $PLL\_B_2$ 133, $PLL\_C_1$ 134, and $PLL\_C_2$ 135 respectively.

Incidentally, the OSC 43 may be arranged on the outside of the LSI 103. In other words, the clock having the frequency f may be supplied from an external source.

The first selector 531 is connected in the immediate downstream of the OSC 43, and the PLL_A 131 is connected to the OSC 43 through the first selector 531. Furthermore, the first selector 531 is connected to the signal generator 201A of the test device 201 in a test mode (the detail of which is explained later). Furthermore, the first selector 531 selects and outputs the clock having frequency f generated by the OSC 43 to the PLL_A 131 in the normal mode (the detail of which is explained later), and selects and outputs the test clock having frequency ft generated by the signal generator 201A to the PLL_A 131 in the test mode.

The first frequency dividing circuit 331 is connected in the immediate downstream of the PLL_A 131, and the $PLL\_B_1$ 132 is connected to the PLL_A 131 through the first frequency dividing circuit 331.

The second selector 532 is connected in the immediate downstream of the first frequency dividing circuit 331, and the $PLL\_B_2$ 133 is connected to the third frequency dividing circuit 331 through the second selector 532. Furthermore, the second frequency dividing circuit 332 is connected in the immediate downstream of the $PLL\_B_1$ 132, and the second selector 532 is connected to the $PLL\_B_1$ 132 through the second frequency dividing circuit 332. Furthermore, the second selector 532 selects and outputs the output clock from the first frequency dividing circuit 331 to the $PLL\_B_2$ 133 in the normal mode, and selects and outputs the output clock from the second frequency dividing circuit 332 to the $PLL\_B_2$ 133 in the test mode.

The third selector 533 is connected in the immediate downstream of the first selector 531, and the $PLL\_C_1$ 134 is connected to the OSC 43 through the first and third selectors 531 and 533. Furthermore, the third frequency dividing circuit 333 is connected in the immediate downstream of the $PLL\_B_2$ 133, and the third selector 533 is connected to the $PLL\_B_2$ 133 through the third frequency dividing circuit 333. Furthermore, the third selector 533 selects and outputs the clock having frequency f generated by the OSC 43 to the $PLL\_C_1$ 134 in the normal mode, and selects and outputs the output clock from the third frequency dividing circuit 333 to the $PLL\_C_1$ 134 in the test mode.

The fourth selector 534 is connected in the immediate downstream of the first selector 531, and $PLL\_C_2$ 135 is connected to the OSC 43 through the first selector 531 and the fourth selector 534. Furthermore, the fourth frequency dividing circuit 334 is connected in the immediate downstream of the $PLL\_C_1$ 134, and the fourth selector 534 is connected to the $PLL\_C_1$ 134 through the fourth frequency dividing circuit 334. Furthermore, the fourth selector 534 selects and outputs the clock having frequency f generated by the OSC 43 to the $PLL\_C_2$ 135 in the normal mode, and selects and outputs the output clock from the fourth frequency dividing circuit 334 to the $PLL\_C_2$ 135 in the test mode.

That is, the PLL_A 131 and $PLL\_B_1$ 132, $PLL\_B_1$ 132 and $PLL\_B_2$ 133, $PLL\_B_2$ 133 and $PLL\_C_1$ 134, and $PLL\_C_1$ 134 and $PLL\_C_2$ 135 are connected through the first frequency dividing circuit 331, second frequency dividing circuit 332, third frequency dividing circuit 333, and fourth frequency dividing circuit 334 respectively in the test mode. Furthermore, the PLL_A 131, $PLL\_B_1$ 132, $PLL\_B_2$ 133, $PLL\_C_1$ 134, and $PLL\_C_2$ 135 are connected in series through the first frequency dividing circuit 331, second frequency dividing circuit 332, third frequency dividing circuit 333, and fourth frequency dividing circuit 334 respectively in the test mode.

In other words, the second frequency dividing circuit 332 is connected between the $PLL\_B_1$ 132 and $PLL\_B_2$ 133. Furthermore, the fourth frequency dividing circuit 334 is connected between the $PLL\_C_1$ 134 and $PLL\_C_2$ 135. In this manner, the second frequency dividing circuit 332 and fourth frequency dividing circuit 334 functions as the first frequency dividing circuit.

Furthermore, the third frequency dividing circuit 333 is connected between the first PLL group 136 and second PLL group 137 in the test mode. In this manner, the third frequency dividing circuit 333 functions as the second frequency dividing circuit.

Assume that the PLL_A 131 has a frequency multiplication factor A. The PLL_B$_1$ 132 and PLL_B$_2$ 133 have a frequency multiplication factor B. The PLL_C$_1$ 134 and PLL_C$_2$ 135 have a frequency multiplication factor C.

Furthermore, the first frequency dividing circuit 331 has a frequency division factor N.

Furthermore, in a test mode, the second frequency dividing circuit 332 frequency-divides the output clock from the PLL_B$_1$ 132 such that the resulting frequency is equal to the frequency of an input clock to the PLL_B$_2$ 133 operating in the normal mode. Specifically, the second frequency dividing circuit 332 has a frequency division factor equivalent to the reciprocal of the frequency multiplication factor of the PLL_B$_1$ 132. That is, the frequency division factor of the second frequency dividing circuit 332 is 1/B.

Furthermore, in the test mode, the third frequency dividing circuit 333 frequency-divides the output clock from the PLL_B$_2$ 133 of the first PLL group 136 such that the resulting frequency is equal to the frequency of an input clock to the PLL_C$_1$ 134 of the second PLL group 137 operating in the normal mode.

Specifically, the third frequency dividing circuit 333 has a frequency division factor equivalent to the reciprocal of the product of the frequency multiplication factor of the PLL_A 131 and the frequency multiplication factor of the PLL_B$_1$ 132 That is, the frequency division factor of the third frequency dividing circuit 333 is N/A×.

Furthermore, in the test mode, the fourth frequency dividing circuit 334 frequency-divides the output clock from the PLL_C$_1$ 134 such that the resulting frequency is equal to the frequency of an input clock to the PLL_C$_2$ 135 operating in the normal mode. Specifically, the fourth frequency dividing circuit 334 has a frequency division factor equivalent to the reciprocal of the frequency multiplication factor of the PLL_C$_1$ 134. That is, the frequency division factor of the fourth frequency dividing circuit 334 is 1/C.

The term "normal mode" means a mode in which a clock having frequency f generated by the OSC 43 is frequency-multiplied by A, C, and C at PLL_A 131, PLL_C$_1$ 134, and PLL_C$_2$ 135 respectively, and each signal is supplied to the logic circuit A 631, logic circuit C1 634, and logic circuit C2 635 respectively so that the logic circuit A 631, logic circuit C1 634, and logic circuit A2 635 operate. Furthermore, the term "normal mode" also means a mode in which a clock having frequency f generated by the OSC 43 is frequency-multiplied by A at the PLL_A 131, and frequency-divided by N at the first frequency dividing circuit 331 to generate a clock having frequency (A/N)×f, and the clock having frequency (A/N)×f is inputted and frequency-multiplied by B and B at the PLL_B$_1$ 132 and PLL_B$_2$ 133 respectively, and supplied to the logic circuit B1 632, logic circuit B2 633 respectively so that the logic circuit B1 632, logic circuit B2 633 operate.

Furthermore, the term "test mode" means a mode in which the test for PLLs embedded in the LSI 103 (i.e., the PLL_A 131, PLL_B$_1$ 132, PLL_B$_2$ 133, PLL_C$_1$ 134, and PLL_C$_2$ 135 in this embodiment) is performed.

Then, in the test mode, the output clock having the frequency ft generated by the signal generator 201A is inputted to the PLL_A 131, and frequency-multiplied by A at the PLL_A 131. Next, the clock having frequency A×ft is inputted to the first frequency dividing circuit 331, and frequency-divided to 1/N at the first frequency dividing circuit 331. Next, the output clock having the frequency (A/N)×ft from the first frequency dividing circuit 331 is inputted to and frequency-multiplied by B at the PLL_B$_1$ 132. Next, the clock having the frequency (A×B/N)×ft is inputted to the second frequency dividing circuit 332, and frequency-divided to 1/B at the second frequency dividing circuit 332. Next, the output clock having the frequency (A/N)×ft from the first frequency dividing circuit 331 is inputted to and frequency-multiplied by B at the PLL_B$_2$ 133. Next, the clock having the frequency (A×B/N)×ft is inputted to the third frequency dividing circuit 333, and frequency-divided to N/A×B at the third frequency dividing circuit 333. Next, the output clock having the frequency ft from the third frequency dividing circuit 333 is inputted to and frequency-multiplied by C at the PLL_C$_1$ 134. Next, the clock having the frequency C×ft is inputted to the fourth frequency dividing circuit 334, and frequency-divided to 1/C at the fourth frequency dividing circuit 334. Next, the output clock having the frequency ft from the fourth frequency dividing circuit 334 is inputted to and frequency-multiplied by C at the PLL_C$_2$ 135, and thereby the clock having frequency C×ft is inputted to the signal measuring device 201B.

That is, similarly to the normal mode, a clock having the same frequency ft is inputted to the PLL_A 131, PLL_C$_1$ 134, and PLL_C$_2$ 135, and clocks multiplied by A, C and C are inputted to the logic circuit A 631, logic circuit C1 634, and logic circuit C2635 respectively even in the test mode. Furthermore, similarly to the normal mode, a clock having the same frequency (A/N)×ft is inputted to the PLL_B$_1$ 132 and PLL_B$_2$ 133, and clocks multiplied by B and B are inputted to the logic circuit B1 632 and logic circuit B2 633 respectively even in the test mode.

Next, a method of testing a LSI 103 in accordance with the third embodiment of the present invention is explained hereinafter. A method of testing a LSI 103 in accordance with the present invention is used to examine PLLs embedded in the LSI 103.

Firstly, a test device 201 is connected to the LSI 103. In particular, a signal generator 201A is connected to a first selector 531 located in the upstream of the PLL_A 131, and a signal measuring device 201B is connected in the downstream of the PLL_C$_2$ 135.

Next, the signal generator 201A generates a test clock having frequency ft. At the same time, the test device 201 sends a control signal such that the first selector 531 inputs the test clock having frequency ft generated by the signal generator 201A to the PLL_A 131. Furthermore, the test device 201 sends a control signal such that the second selector 532 inputs the output clock from the second frequency dividing circuit 332 to the PLL_B$_2$ 133. Furthermore, the test device 201 sends a control signal such that the third selector 533 inputs the output clock from the third frequency dividing circuit 333 to the PLL_C$_1$ 134. Furthermore, the test device 201 sends a control signal such that the fourth selector 534 inputs the output clock from the fourth frequency dividing circuit 334 to the PLL_C$_2$ 135. Then, the signal measuring device 201B measures the frequency of the output clock from the PLL_C$_2$ 135.

At this point, if the PLL_A 131 functions normally, the frequency of the output clock from the PLL_A 131 becomes the frequency A×ft. Next, since the output clock from the PLL_A 131 is frequency-divided to 1/N at the first frequency dividing circuit 331, the frequency of the output clock from the first frequency dividing circuit 331 becomes (A/N)×ft. Next, if the PLL_B$_1$ 132 functions normally, the frequency of the output clock from the PLL_B$_1$ 132 becomes the frequency (A×B/N)×ft. Next, since the output clock from the PLL_B$_1$ 132 is frequency-divided to 1/N at the second frequency dividing circuit 332, the frequency of the output clock from the second frequency dividing circuit 332 becomes (A/N)×ft. Next, if the PLL_B$_2$ 133 functions normally, the frequency of the output clock from the PLL_B$_2$ 133 becomes the frequency (A×B/N)×ft. Next, since the output clock from the PLL_$B_2$ 133 is frequency-divided to N/A×B at the third frequency dividing circuit 333, the frequency of the output clock from the third frequency dividing circuit 333 becomes ft. Next, if the PLL_$C_1$ 134 functions normally, the frequency of the output clock from the PLL_$C_1$ 134 becomes the frequency C×ft. Next, since the output clock from the PLL_$C_1$ 134 is frequency-divided to 1/C at the fourth frequency dividing circuit 334, the frequency of the output clock from the fourth frequency dividing circuit 334 becomes ft. Next, if the PLL_$C_2$ 135 functions normally, the frequency of the output clock from the PLL_$C_2$ 135 becomes the frequency C×ft. Therefore, if any one or all of the PLL_A 131, PLL_$B_1$ 132, PLL_$B_2$ 133, PLL_$C_1$ 134, and PLL_$C_2$ 135 are defective, the clock measured at the signal measuring device 201B does not have the frequency C×ft. In this manner, the examination of plural PLLs embedded in the LSI 103 can be performed in a single test.

As explained above, in the LSI 103 and the method of testing PLLs in the LSI 103, PLL_A 131, PLL_$B_1$ 132, PLL_$B_2$ 133, PLL_$C_1$ 134, and PLL_$C_2$ 135 are connected in series in the normal mode and test mode. Furthermore, input clocks having the same frequency as in the normal mode are inputted to the PLL_$B_2$ 133, PLL_$C_1$ 134, and PLL_$C_2$ 135. Therefore, the examination of a plurality of PLLs embedded in the LSI 103 can be performed in a single test even if the PLLs have different frequencies in the normal mode. As a result, it can reduce the time needed to examine PLLs.

Incidentally, the number of the PLL groups embedded in the LSI 103 is not limited to the exemplary number of groups in this embodiment. Furthermore, the number of PLLs in each PLL group may be also varied in other embodiments. For example, in the case where LSI 103 includes P PLL groups (P is an integer satisfying P≧2) and each PLL group has S PLLs (S is an integer satisfying S≧2) to which clocks having the same frequency is inputted in the normal mode, in the test mode, the (k−1)th PLL (k is an integer satisfying 2≦k≦S) and the kth PLL may be connected in series through the first frequency dividing circuit, the (r−1)th PLL group (r is an integer satisfying 2≦r≦S) and the rth PLL group may be connected in series through the second frequency dividing circuit, the first frequency dividing circuit may frequency-divide the output clock from the (k−1)th PLL such that the resulting frequency is equal to the frequency of an input clock to the kth PLL operating in the normal mode, and the second frequency dividing circuit may frequency-divide the output clock from the Sth PLL of the (r−1)th PLL group such that the resulting frequency is equal to the frequency of an input clock to the first PLL of the rth PLL group operating in the normal mode. In this case, the first frequency dividing circuit has a frequency division factor equivalent to the reciprocal of the frequency multiplication factor of the (k−1)th PLL. Furthermore, the second frequency dividing circuit has a frequency division factor equivalent to the reciprocal of (the frequency of input clock to the Sth PLL of the (r−1)th PLL group)/(the frequency of input clock to the first PLL of the rth PLL group).

Furthermore, a PLL group having a plurality of PLL_A 131, . . . , which are connected in parallel in the normal mode and connected in series through a frequency dividing circuit having a frequency division factor 1/A may be formed between the first selector 531 and first frequency dividing circuit 331. In this case, the first frequency dividing circuit 331 connects the PLL group having a plurality of PLL_A 131, . . . , to the first PLL group 136, and functions as the third frequency dividing circuit in the normal mode and test mode. Furthermore, the PLL group having a plurality of PLL_A 131, . . . , functions as the first PLL (phase-locked loop circuit) group. Furthermore, the first PLL group 136 and second PLL group 137 functions as the second PLL (phase-locked loop circuit) group and third PLL (phase-locked loop circuit) group respectively.

Fourth Embodiment

Figure 5:
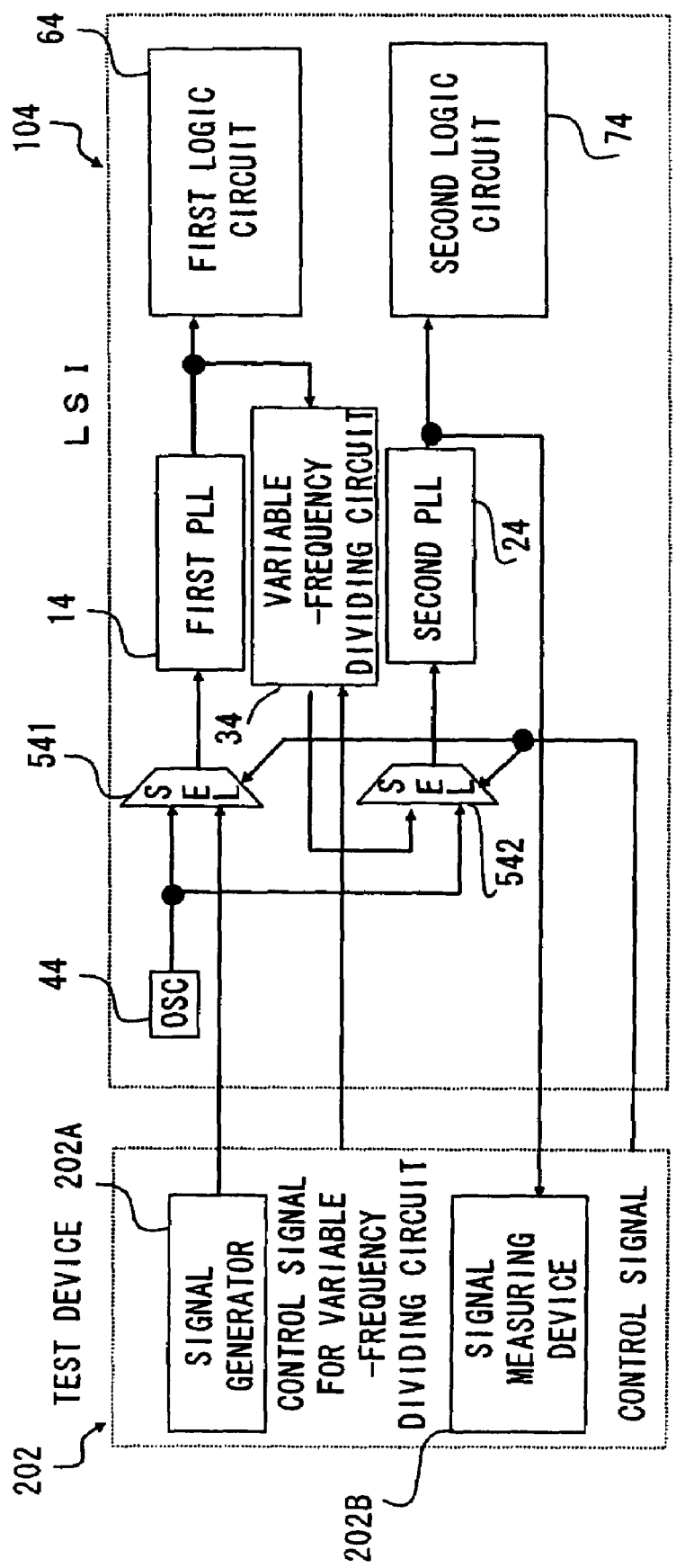
FIG. 5 is a block diagram showing a schematic structure of a LSI and a test device in accordance with a fourth embodiment of the present invention.
Figure 6:
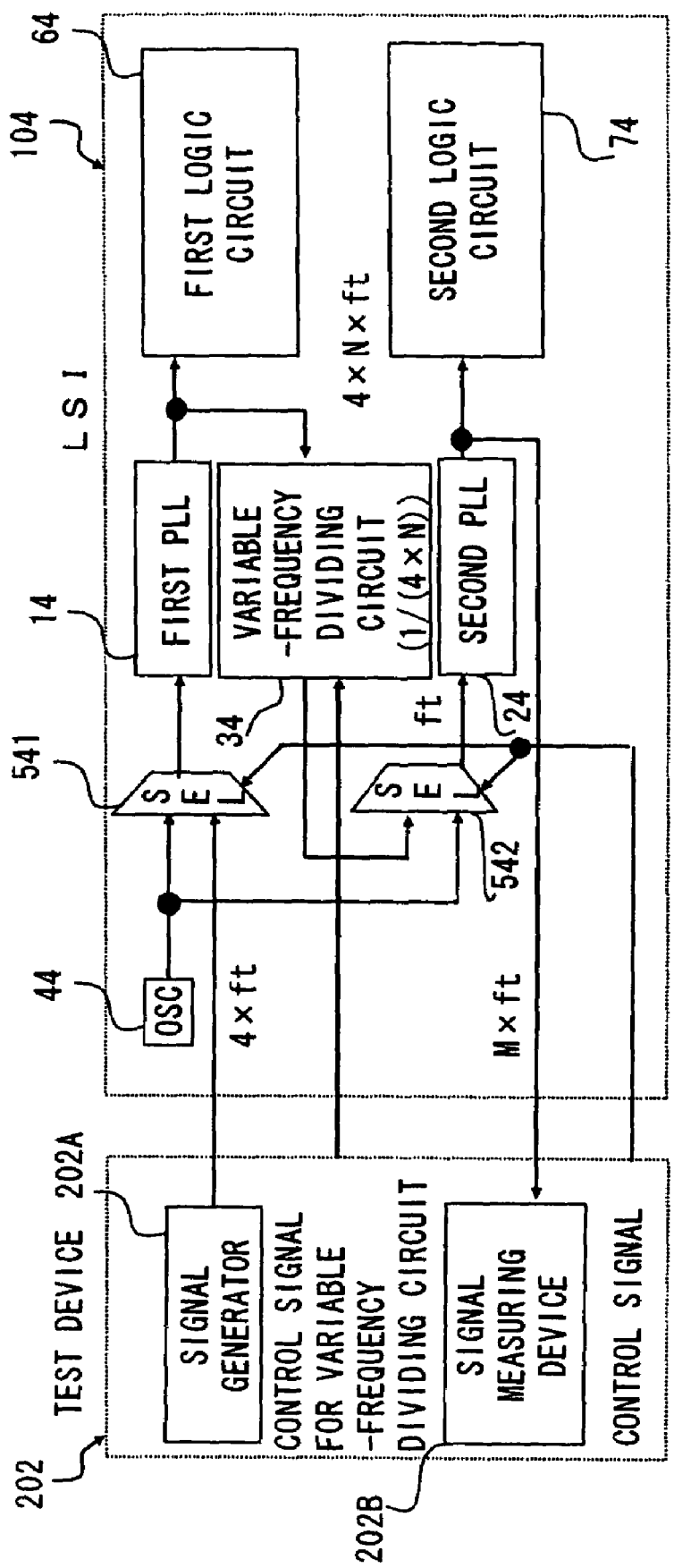
FIG. 6 is a block diagram showing a schematic structure of a LSI and a test device in accordance with a fifth embodiment of the present invention.
Figure 7:
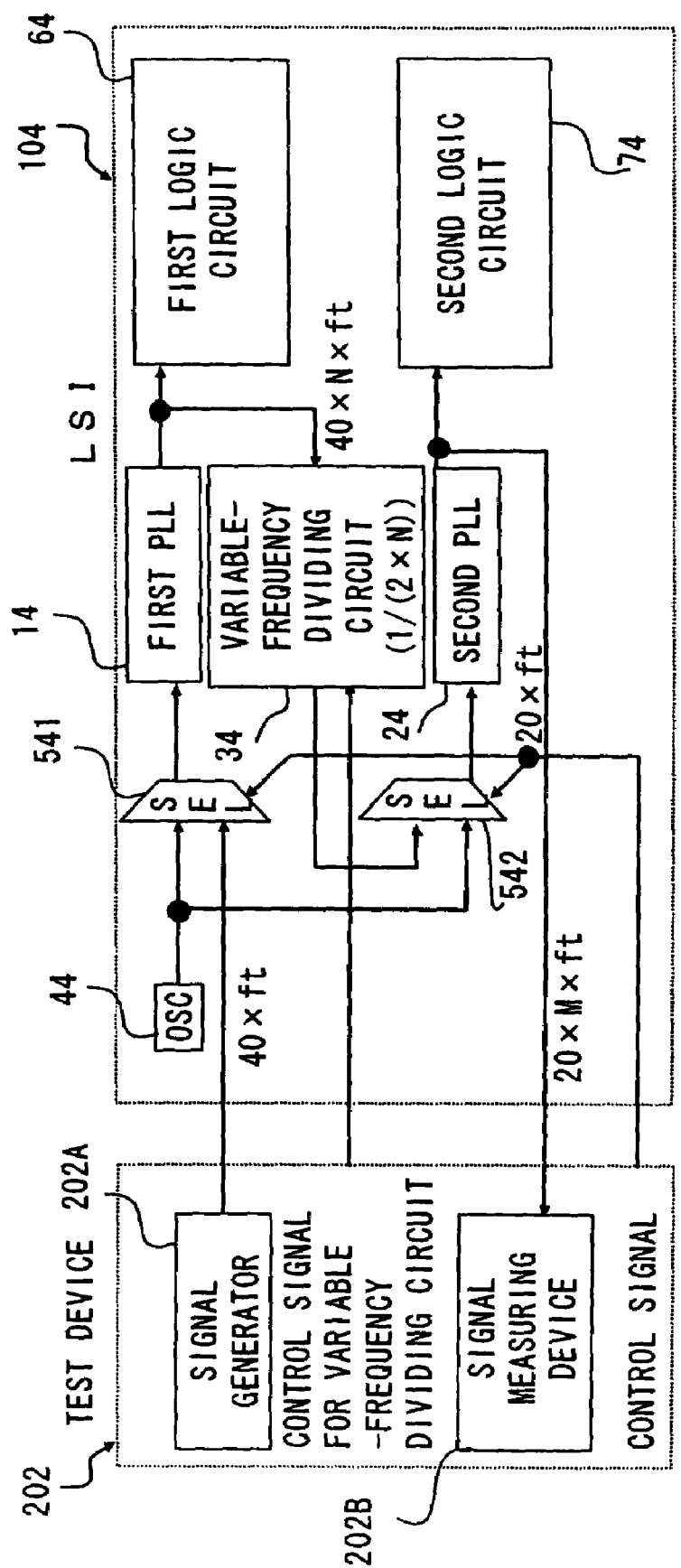
FIG. 7 is a block diagram showing a schematic structure of a LSI and a test device in accordance with a sixth embodiment of the present invention.
Figure 8:
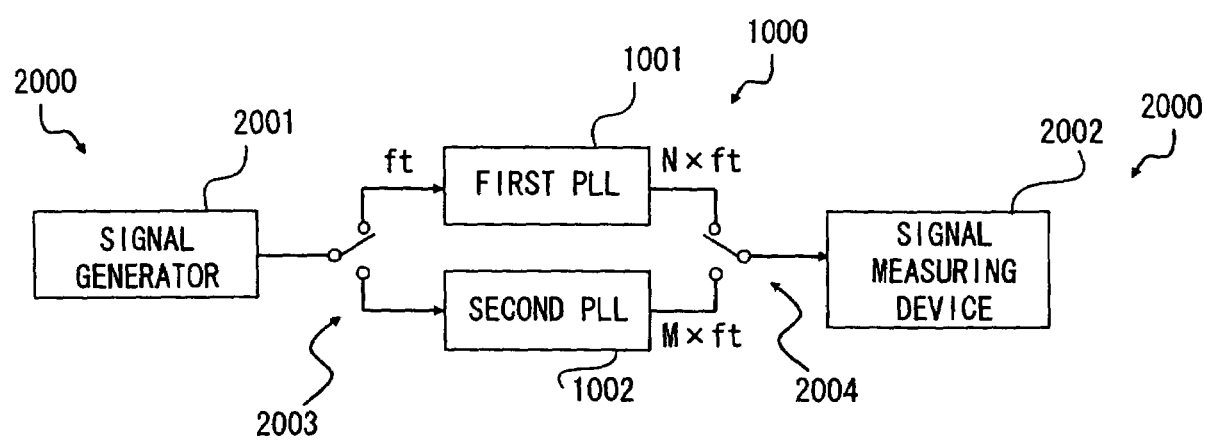
FIG. 8 is a block diagram showing a schematic structure of a LSI and a test device in prior art.
Figure 9:
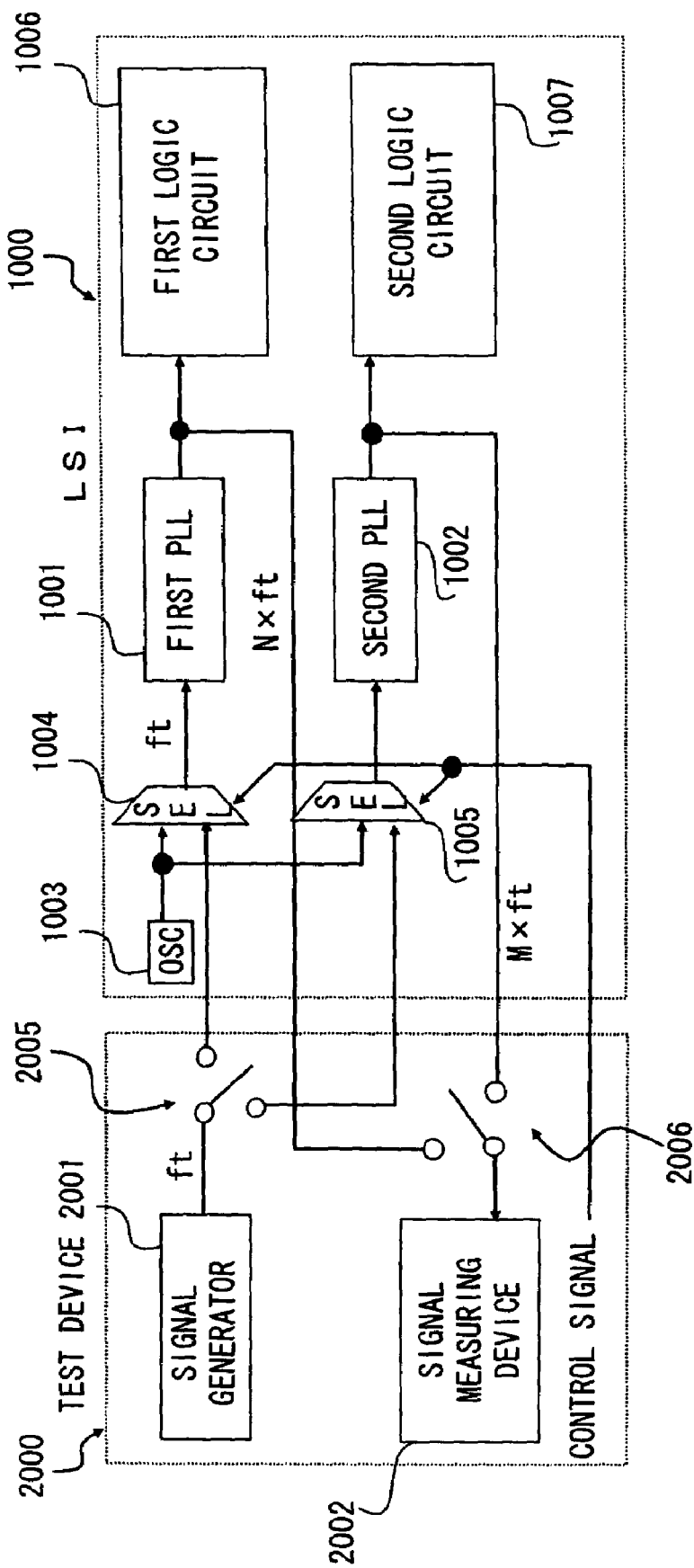
FIG. 9 is a block diagram showing a schematic structure of a LSI and a test device in prior art.

A LSI 104 in accordance with a fourth embodiment of the present invention is explained hereinafter with reference to FIGS. 5-7. FIGS. 5-7 is a block diagram showing a schematic structure of the LSI 104 and test device 202 in accordance with a fourth embodiment of the present invention.

As shown in FIG. 5, the test device 202 includes a signal generator 202A, a signal measuring device 202B and the like.

The signal generator 202A, for example, generates and outputs a test clock to examine PLLs embedded in the LSI 104. In particular, the signal generator 202A generates a lower limit frequency and upper limit frequency of the first PLL 14. Furthermore, the test device 202 outputs a control signal for controlling selectors 541 and 542 embedded in the LSI 104.

Furthermore, the test device 202 output a control signal for controlling the frequency division factor of the variable-frequency dividing circuit 34.

As shown in FIG. 5, the LSI 104 includes: an OSC 44 for generating a clock having frequency f; selectors 541 and 542 connected in the downstream of the OSC 44; a first PLL 14 connected to the OSC 44 through the selector 541; a second PLL 24 connected to the OSC 44 through the selector 542; a variable-frequency dividing circuit 34 to which the output clock from the first PLL 14 is inputted; a first logic circuit 64 operating with the output clock from the first PLL 14; and a second logic circuit 74 operating with the output clock from the second PLL 24.

Incidentally, the OSC 44 may be arranged on the outside of the LSI 104. In other words, the clock having the frequency f may be supplied from an external source.

Assume that the first PLL 14 has a frequency multiplication factor N. Assume also that second PLL 24 has a frequency multiplication factor M. Furthermore, the input frequency range of the first PLL 14 and the input frequency range of the second PLL 24 is different. In this embodiment, for example, the input frequency range of the first PLL 14 is from 4×ft to 40×ft, and the input frequency range of the second PLL 24 is from 1×ft to 20×ft.

The term "normal mode" means a mode in which a clock having frequency f generated by the OSC 44 is frequency-multiplied by N and M at the first and second PLLs 14 and 24 respectively, and each signal is supplied to the first and second logic circuits 64 and 74 so that the first and second logic circuits 64 and 74 operate.

Furthermore, the term "test mode" means a mode in which the test for the PLLs embedded in the LSI 104 (i.e., the first and second PLLs 14 and 24 in this embodiment) is performed.

The selector 541 connected to the first PLL 14 receives a clock having frequency f generated by the OSC 44 and a test clock generated by the signal generator 202A.

Then, the selector 541 selects and outputs the clock having frequency f generated by the OSC 44 to the first PLL 14 in the normal mode, and selects and outputs the test clock generated by the signal generator 202A to the first PLL 14 in the test mode.

Furthermore, the selector 542 connected to the second PLL 24 receives a clock having frequency f generated by the OSC 44 and an output clock from the variable-frequency dividing circuit 34.

Then, the selector 542 selects and outputs the clock having frequency f generated by the OSC 44 to the second PLL 24 in the normal mode, and selects and outputs the output clock from the variable-frequency dividing circuit 34 to the second PLL 24 in the test mode.

That is, in the test mode, the first PLL 14 and second PLL 24 are connected in series through the variable-frequency dividing circuit 34. In other words, in the test mode, the output clock from the first PLL 14 is inputted to the variable-frequency dividing circuit 34, and the output clock from the variable-frequency dividing circuit 34 is inputted to the second PLL 24.

The variable-frequency dividing circuit 34 has a variable frequency division factor.

Specifically, the variable-frequency dividing circuit 34 frequency-divides the output clock from the first PLL 14 such that a clock having the lower limit frequency of the second PLL 24 is inputted to the second PLL_24 in a test mode for testing the input frequency lower limit.

More specifically, as shown in FIG. 6, the signal generator 202A generates, for example, a test clock having frequency 4×ft which is the lower limit input frequency of the first PLL 14 in the test mode for testing the input frequency lower limit. Next, the test clock having the frequency 4×ft is frequency-multiplied by N at the first PLL 14. Consequently, a clock having frequency 4×N×ft is inputted to the variable-frequency dividing circuit 34. Therefore, the variable-frequency dividing circuit 34 frequency-divides the clock having frequency 4×N×ft to ¼×N to generate a clock having frequency 1×ft which is the lower limit input frequency of the second PLL 24. In other words, the variable-frequency dividing circuit 34 frequency-divides the output clock from the first PLL 14 by the frequency division factor equal to the reciprocal of (the lower limit input frequency of the first PLL 14)/(the lower limit input frequency of the second PLL 24)×(the multiplication factor of the first PLL 14).

Furthermore, the variable-frequency dividing circuit 34 frequency-divides the output clock from the first PLL 14 such that a clock having the upper limit frequency of the second PLL 24 is inputted to the second PLL_24 in a test mode for testing the input frequency upper limit.

More specifically, as shown in FIG. 7, the signal generator 202A generates, for example, a test clock having frequency 40×ft which is the upper limit input frequency of the first PLL 14 in the test mode for testing the input frequency upper limit. Next, the test clock having the frequency 40×ft is frequency-multiplied by N at the first PLL 14. Consequently, a clock having frequency 40×N×ft is inputted to the variable-frequency dividing circuit 34. Therefore, the variable-frequency dividing circuit 34 frequency-divides the clock having frequency 40×N×ft to ½×N to generate a clock having frequency 20×ft which is the lower limit input frequency of the second PLL 24. In other words, the variable-frequency dividing circuit 34 frequency-divides the output clock from the first PLL 14 by the frequency division factor equal to the reciprocal of (the upper limit input frequency of the first PLL 14)/(the upper limit input frequency of the second PLL 24)×(the multiplication factor of the first PLL 14).

Next, a method of testing a LSI 104 in accordance with the fourth embodiment of the present invention is explained hereinafter. A method of testing a LSI 104 in accordance with the present invention is used to examine PLLs embedded in the LSI 104.

Firstly, a test device 202 is connected to the LSI 104. In particular, a signal generator 202A is connected to a selector 541 located in the upstream of the first PLL 14, and a signal measuring device 202B is connected in the downstream of the second PLL 24.

Next, as shown in FIG. 6, the signal generator 202A generates, for example, a test clock having frequency 4×ft in the test mode for testing the input frequency lower limit. At the same time, the test device 202 sends a control signal such that the selector 541 connected to the first PLL 14 inputs the test clock having frequency 4×ft generated by the signal generator 202A to the first PLL 14. Furthermore, the test device 202 sends a control signal such that the selector 542 connected to the second PLL 24 inputs the output clock from the variable-frequency dividing circuit 34 to the second PLL 24. Furthermore, the test device 202 sends a control signal such that the variable-frequency dividing circuit 34 sets the frequency division factor to ¼×N. Then, the signal measuring device 202B measures the frequency of the output clock from the second PLL 24.

At this point, if the first PLL 14 functions normally, the frequency of the output clock from the first PLL 14 becomes the frequency 4×N×ft. Next, since the output clock from the first PLL 14 is frequency-divided by the variable-frequency dividing circuit 34, the frequency of the input clock to the second PLL 24 becomes the frequency 1×ft. Then, if the second PLL 24 functions normally, the frequency of the output clock from the second PLL 24 becomes the frequency M×ft. Therefore, if one or both of the first and second PLLs 14 and 24 are defective, the clock measured at the signal measuring device 202B does not have the frequency M×ft. In this manner, the examination of each phase-locked loop circuit embedded in the LSI 104 can be performed in a single test.

On the other hand, as shown in FIG. 7, the signal generator 202A generates, for example, a test clock having frequency 40×ft in the test mode for testing the input frequency upper limit. At the same time, the test device 202 sends a control signal such that the selector 541 connected to the first PLL 14 inputs the test clock having frequency 40×ft generated by the signal generator 202A to the first PLL 14. Furthermore, the test device 202 sends a control signal such that the selector 542 connected to the second PLL 24 inputs the output clock from the variable-frequency dividing circuit 34 to the second PLL 24. Furthermore, the test device 202 sends a control signal such that the variable-frequency dividing circuit 34 sets the frequency division factor to ½×N. Then, the signal measuring device 202B measures the frequency of the output clock from the second PLL 24.

At this point, if the first PLL 14 functions normally, the frequency of the output clock from the first PLL 14 becomes the frequency 40×N×ft. Next, since the output clock from the first PLL 14 is frequency-divided by the variable-frequency dividing circuit 34, the frequency of the input clock to the second PLL 24 becomes the frequency 20×ft. Then, if the second PLL 24 functions normally, the frequency of the output clock from the second PLL 24 becomes the frequency 20×M×ft. Therefore, if one or both of the first and second PLLs 14 and 24 are defective, the clock measured at the signal measuring device 202B does not have the frequency 20×M×ft. In this manner, the examination of each phase-locked loop circuit embedded in the LSI 104 can be performed in a single test.

Incidentally, although the lower limit and upper limit are defined as 4×ft and 40×ft respectively for ease of explanation in this embodiment, they are not limited to these values. In general, the operation environment of a PLL will vary depending on ambient temperature in the actual working environment. For such case, an input clock to a PLL having frequency shifted from the frequency ft of the clock from an OSC 44 by several to several tens percent can simulate the similar environment. This embodiment is suited for testing whether a PLL will work normally even under such environment. In this case, the lock range of a LSI can be examined by using a clock whose actual frequency ft is varied by ±several percent to several tens percent.

As explained above, in the LSI 104 and the method of testing the LSI 104, the first PLL 14 and second PLL 24 are connected in series through the variable-frequency dividing circuit 34 in the test mode. Furthermore, the variable-frequency dividing circuit 34 frequency-divides the output clock from the first PLL 14 such that a clock having the lower limit frequency of the second PLL 24 is inputted to the second PLL_24 in a test mode for testing the input frequency lower limit. Furthermore, the variable-frequency dividing circuit 34 frequency-divides the output clock from the first PLL 14 such that a clock having the upper limit frequency of the second PLL 24 is inputted to the second PLL 24 in a test mode for testing the input frequency upper limit. In this manner, the examination of the lock ranges of the first and second PLLs 14 and 24 can be performed in a single test. As a result, it can reduce the time needed to examine the lock ranges of a PLL.

Incidentally, although two PLLs are embedded in the LSI 104, more than two PLLs may be embedded in the LSI 104 in a similar manner to Second embodiment. In this case, the LSI 104 includes S PLLs (S is an integer satisfying S≧2) and S−1 variable-frequency dividing circuit 341, 342, . . . , 34S−1 in which the (k−1)th PLL (k is an integer satisfying 2≦k≦S) is connected to the kth PLL through the variable-frequency dividing circuit 34$k$−1.

Furthermore, in fourth embodiment, the PLLs may be examined with the same operating condition as in the normal mode in a similar manner to First embodiment by generating a test clock having frequency ft at the signal generator 202A, and setting the frequency division factor of the variable-frequency dividing circuit 34 to the reciprocal of the frequency multiplication factor of the first PLL 14.

In accordance with an embodiment of the present invention, a LSI further includes a counter, in which a test may be performed by connecting all PLLs in series from the most upstream to the most downstream by frequency dividing circuit or PLLs designed for connection, inputting a clock generated by an OSC to the PLL in the most upstream, and counting the output clock from the PLL in the most downstream with the counter.

Furthermore, in accordance with an embodiment of the present invention, a LSI further includes an output terminal(s) for measuring the output clock from each PLL embedded in the LSI by a signal measuring device so that each PLL is examined separately within the LSI and the counted value is externally outputted.

It is apparent that the present invention is not limited to the above embodiments, but may be modified and changed without departing from the scope and spirit of the invention.

What is claimed is:

1. A semiconductor integrated circuit comprising:
S phase-locked loop circuits (S is an integer satisfying S≧2), the (k−1)th phase-locked loop circuit of the S phase-locked loop circuits being connected to the kth phase-locked loop circuit in series (k is an integer satisfying 2≦k≦S) in a test mode; and
a circuit connected between the (k−1)th phase-locked loop circuit and the kth phase-locked loop circuit in the test mode, and one of frequency-dividing and frequency-multiplying an output clock from the (k−1)th phase-locked loop circuit such that a frequency of a clock inputted to the kth phase-locked loop circuit in a normal mode is the same as a frequency of a clock inputted to the kth phase-locked loop circuit in the test mode.

2. The semiconductor integrated circuit of claim 1, wherein the (k−1)th phase-locked loop circuit and the kth phase-locked loop circuit are connected such that clocks having the same frequencies as in the normal mode are inputted to the (k−1)th phase-locked loop circuit and the kth phase-locked loop circuit in the test mode.

3. The semiconductor integrated circuit of claim 1, wherein the circuit comprises a frequency dividing circuit connected between the (k−1)th phase-locked loop circuit and the kth phase-locked loop circuit in the test mode, and
wherein the frequency dividing circuit frequency-divides the output clock from the (k−1)th phase-locked loop circuit such that a clock having the same frequency as in the normal mode is inputted to the kth phase-locked loop circuit in the test mode.

4. The semiconductor integrated circuit of claim 2, wherein the circuit comprises a frequency dividing circuit connected between the (k−1)th phase-locked loop circuit and the kth phase-locked loop circuit in the test mode,
wherein the frequency dividing circuit frequency-divides the output clock from the (k−1)th phase-locked loop circuit such that a clock having the same frequency as in the normal mode is inputted to the kth phase-locked loop circuit in the test mode.

5. The semiconductor integrated circuit of claim 3, wherein the frequency dividing circuit has a frequency division factor equivalent to the reciprocal of the frequency multiplication factor of the (k−1)th phase-locked loop circuit.

6. The semiconductor integrated circuit of claim 1, wherein the circuit comprises a frequency dividing circuit connected between the (k−1)th phase-locked loop circuit and said kth phase-locked loop circuit in the test mode, and
wherein a clock having the same frequency as in the normal mode is inputted to the kth phase-locked loop circuit in the test mode, and the frequency dividing circuit has a variable frequency division factor.

7. The semiconductor integrated circuit of claim 1, wherein the circuit comprises a phase-locked loop circuit designed for connection connected between the (k−1)th phase-locked loop circuit and the kth phase-locked loop circuit in the test mode,
wherein the phase-locked loop circuit designed for connection frequency-multiplies the output clock from the (k−1)th phase-locked loop circuit such that a clock having the same frequency as in the normal mode is inputted to the kth phase-locked loop circuit in the test mode.

8. The semiconductor integrated circuit of claim 2, wherein the circuit comprises a phase-locked loop circuit designed for connection connected between the (k−1)th phase-locked loop circuit and the kth phase-locked loop circuit in the test mode, and
wherein the phase-locked loop circuit designed for connection frequency-multiplies the output clock from the (k−1)th phase-locked loop circuit such that a clock having the same frequency as in the normal mode is inputted to the kth phase-locked loop circuit in the test mode.

9. The semiconductor integrated circuit of claim 1, wherein the clock inputted to the kth phase-locked loop circuit in a normal mode comprises a clock generated by an oscillator clock and the clock inputted to the kth phase-locked loop circuit in the test mode comprises an output clock from the circuit.

10. The semiconductor integrated circuit of claim 9, further comprising:
a first selector which is connected to the kth phase-locked loop circuit and selects and outputs the clock generated by an oscillator clock to the kth phase-locked loop circuit in a normal mode and selects and outputs the output clock from the circuit to the kth phase-locked loop circuit in a test mode.

11. The semiconductor integrated circuit of claim 10, further comprising:
a second selector which is connected to the (k−1)th phase-locked loop circuit and selects and outputs the clock generated by an oscillator clock to the (k−1)th phase-locked loop circuit in a normal mode and selects and outputs a test clock generated by a signal generator of a test device to the (k−1)th phase-locked loop circuit in a test mode.

12. The semiconductor integrated circuit of claim 11, further comprising:
a first logic circuit, a clock inputted to the first logic circuit in a test mode comprising the test clock frequency multiplied at the (k−1)th phase-locked loop circuit; and
a second logic circuit, a clock inputted to the second logic circuit in a test mode comprising the test clock frequency multiplied at the kth phase-locked loop circuit.

13. The semiconductor integrated circuit of claim 11, wherein the first and second selectors are controlled by a control signal of the test device.

14. A semiconductor integrated circuit comprising:
P phase-locked loop circuit groups (P is an integer satisfying P≧2), each of the phase-locked loop circuit group having S phase-locked loop circuits (S is an integer satisfying S≧2) to which clocks having the same frequency is inputted in a normal mode;
a first frequency dividing circuit connected in series between the (k−1)th phase-locked loop circuit (k is an integer satisfying 2≦k≦S) and the kth phase-locked loop circuit of the P phase-locked loop circuit groups in a test mode; and
a second frequency dividing circuit connected between the (r−1)th phase-locked loop circuit group (r is an integer satisfying 2≦r≦P) and the rth phase-locked loop circuit group in the test mode,
wherein the (k−1) phase-locked loop circuit and the kth phase-locked loop circuit are connected in series, and the (r−1)th phase-locked loop circuit group and the rth phase-locked loop circuit group are connected in series,
wherein the first frequency dividing circuit frequency-divides the output clock from the (k−1)th phase-locked loop circuit such that the resulting frequency is equal to the frequency of an input clock to the kth phase-locked loop circuit operating in the normal mode, and
wherein the second frequency dividing circuit frequency-divides the output clock from the Sth phase-locked loop circuit of the (r−1)th phase-locked loop circuit group such that the resulting frequency is equal to the frequency of an input clock to the first phase-locked loop circuit of the rth phase-locked loop circuit group operating in the normal mode.

15. The semiconductor integrated circuit of claim 14, wherein the P phase-locked loop circuit groups comprise:
a first phase-locked loop circuit group and a third phase-locked loop circuit group, to both of which clocks having the same frequency are inputted in the normal mode, an output clock from the first phase-locked loop circuit group being inputted to a third frequency dividing circuit in the normal mode and the test mode; and
a second phase-locked loop circuit group connected to the first phase-locked loop circuit group through the third frequency dividing circuit, the output clock from the third frequency dividing circuit being inputted to the second phase-locked loop circuit group in the normal mode and test mode,
wherein the third frequency dividing circuit connects the second phase-locked loop circuit group to the third phase-locked loop circuit group.

16. A method of testing a semiconductor integrated circuit comprising S phase-locked loop circuits (S is an integer satisfying S≧2), wherein the (k−1)th phase-locked loop circuit (k is an integer satisfying 2≦k≦S) is connected to the kth phase-locked loop circuit in series, the method comprising:
inputting a test signal to the phase-locked loop circuit in the most upstream of the semiconductor integrated circuit;
examining an output clock from a phase-locked loop circuit of the phase-locked loop circuits in the most downstream of the semiconductor integrated circuit; and
one of frequency-dividing and frequency-multiplying an output clock from the (k−1)th phase-locked loop circuit such that a frequency of a clock inputted to the kth phase-locked loop circuit in a normal mode is the same as a frequency of a clock inputted to the kth phase-locked loop circuit in the test mode.

* * * * *